(12) United States Patent
Chiu

(10) Patent No.: US 8,503,177 B2
(45) Date of Patent: Aug. 6, 2013

(54) DETACHABLE USB FAN MODULE MOUNTING STRUCTURE

(75) Inventor: Chien-Lin Chiu, New Taipei (TW)

(73) Assignee: Adlink Technology Inc., New Taipei (TW)

( * ) Notice: Subject to any disclaimer, the term of this patent is extended or adjusted under 35 U.S.C. 154(b) by 221 days.

(21) Appl. No.: 13/198,139

(22) Filed: Aug. 4, 2011

(65) Prior Publication Data

US 2013/0033819 A1    Feb. 7, 2013

(51) Int. Cl.
*H05K 7/20*    (2006.01)

(52) U.S. Cl.
USPC ...... 361/695; 361/679.48; 361/688; 361/694; 165/104.33; 165/122; 454/184; 415/213.1

(58) Field of Classification Search
USPC ....... 361/679.46–679.54, 688, 689, 690–697, 361/715, 724–728; 165/80.3, 104.33, 121–126, 165/185; 454/184; 29/592.1; 415/213.1; 312/223.2, 223.3, 236, 265
See application file for complete search history.

(56) References Cited

U.S. PATENT DOCUMENTS

| | | | | |
|---|---|---|---|---|
| 4,744,005 A | * | 5/1988 | Milani | 361/679.48 |
| 5,562,410 A | * | 10/1996 | Sachs et al. | 415/213.1 |
| 6,313,989 B1 | * | 11/2001 | Kuang | 252/62.9 PZ |
| 6,504,716 B2 | * | 1/2003 | Huang et al. | 361/695 |
| 6,999,313 B2 | * | 2/2006 | Shih | 361/695 |
| 7,411,788 B2 | * | 8/2008 | Liang | 361/695 |
| 7,498,754 B2 | * | 3/2009 | Masood | 315/291 |
| 7,626,818 B2 | * | 12/2009 | Yoshida et al. | 361/695 |
| 7,652,881 B1 | * | 1/2010 | Sun | 361/694 |
| 2007/0277342 A1 | * | 12/2007 | Chen | 15/344 |
| 2012/0263588 A1 | * | 10/2012 | Sun et al. | 415/213.1 |

* cited by examiner

*Primary Examiner* — Michail V Datskovskiy
(74) *Attorney, Agent, or Firm* — Muncy, Geissler, Olds & Lowe, PLLC

(57) ABSTRACT

A detachable USB fan module mounting structure includes a machine case having a top opening and two guide rails at two opposite lateral sides of the top opening, a circuit board with one a USB connector accommodated in the machine case, a cover member detachably covered on the top opening of the machine case and having a coupling structure detachably coupled to the guide rails of the machine case and a bottom bracket with a fan module positioning structure to hold a USB fan module that has a power cord with a USB plug connected to the USB connector of the circuit board.

9 Claims, 7 Drawing Sheets

DETACHABLE USB FAN MODULE MOUNTING STRUCTURE

BACKGROUND OF THE INVENTION

1. Field of the Invention

The present invention relates to USB fan module technology and more particularly, to a detachable USB fan module mounting structure, which comprises a cover member detachably covered on a machine case to carry a USB fan module on a bottom bracket thereof and to have the USB plug of the power cord of the USB fan module be electrically connected to a USB connector at a circuit board inside the machine case. This arrangement facilitates cleaning and maintenance of the USB module.

2. Description of the Related Art

The coming of the information era has greatly changed our lives. Nowadays, many different electronic products have been created and are intensively used everywhere around us. Follow fast development of technology, multipurpose computer-controlled electronic products are continuously created to serve people.

As computer operating speed and processing ability have been greatly improved, many data storage means, CD drive, DVD drive and other hardware devices may be attached. Further, an industrial computer server generally comprises a mainboard, a power supply device, cooling fans and other electronic components. Due to limited internal space, the arrangement of hardware in a server must be well designed. Space for bus line plugging and deplugging must also be taken into account.

Further, to solve the problem of heat dissipation in a computer, server or electronic system (cooling of CPU, chip, interface card, etc.), a fan tray mounting design for allowing replacement of each individual cooling fan may be used. When a fan tray mounting structure is adopted, a riser board will be used for quick connection of the cooling fan to an electrical connector at the main board in the electronic system. The arrangement of the fan tray mounting design with the matching riser board greatly increases the cost of the electronic system. In order to reduce the cost, fan module may be designed for mounting on one detachable cover shell of the housing of the electronic system and then electrically connected to an electrical connector at the main board of the electronic system by a cable. According to this design, the operator must insert the hand into the deep inside of the housing to connect the electrical plug of the cable to the electrical connector of the main board or to disconnect the electrical plug from the electrical connector.

SUMMARY OF THE INVENTION

The present invention has been accomplished under the circumstances in view. It is therefore the main object of the present invention to provide a detachable USB fan module mounting structure, which eliminates the drawbacks of the conventional designs.

According to one of the present invention, the detachable USB fan module mounting structure includes a machine case having a top opening and two guide rails at two opposite lateral sides of the top opening, a circuit board with one a USB connector accommodated in the machine case, a cover member detachably covered on the top opening of the machine case and having a coupling structure detachably coupled to the guide rails of the machine case and a bottom bracket with a fan module positioning structure to hold a USB fan module that has a power cord with a USB plug. This design enables the cover member to be detachably and rapidly installed in the machine case by hand without any tools. Subject to the design of the cover member, a USB fan module of any of a variety of models can be selectively used in the machine case that can be designed for any of a variety of electronic systems for different application purposes (for example, a system equipped with high-power PCI/PCIe cards or for application under a high operating temperature environment). Thus, the invention facilitates cleaning and maintenance of the electrical fan.

According to another aspect of the present invention, each guide rail of the machine case comprises a plurality of vertical insertion notches and a plurality of horizontal retaining slots respectively forwardly extended from the bottom side of each vertical insertion notch. Further, the coupling structure comprises a plurality of coupling rods respectively vertically insertable into the respective vertical insertion notches of the guide rail, and a plurality of retaining tips respectively perpendicularly extended from the coupling rods and vertically insertable with the respective coupling rods into the respective vertical insertion notches of the guide rails and then horizontally engageable into the respective vertical insertion notches of the guide rail upon a horizontal movement of the cover member relative to the machine case and after insertion into the respective vertical insertion notches of the guide rail. Further, the width of each vertical insertion notch of each guide rail is greater than the combined width of each coupling rod with the associating retaining tip so that the coupling rods with the respective retaining tips can be directly and vertically inserted into the respective vertical insertion notches of the guide rails.

According to still another aspect of the present invention, the fan module positioning structure comprises a side plate having a locating hole. Further, the housing of the electrical plug of the power cord of the USB fan module is inserted into the locating hole at the side plate of the fan module positioning structure. As the electrical plug of the power cord of the USB fan module is not rigidly affixed to the side plate of the fan module positioning structure, the electrical plug is adjustable relative to the side plate during installation, avoiding accidental damage.

DETAILED DESCRIPTION OF THE PREFERRED EMBODIMENT

Figure 1:
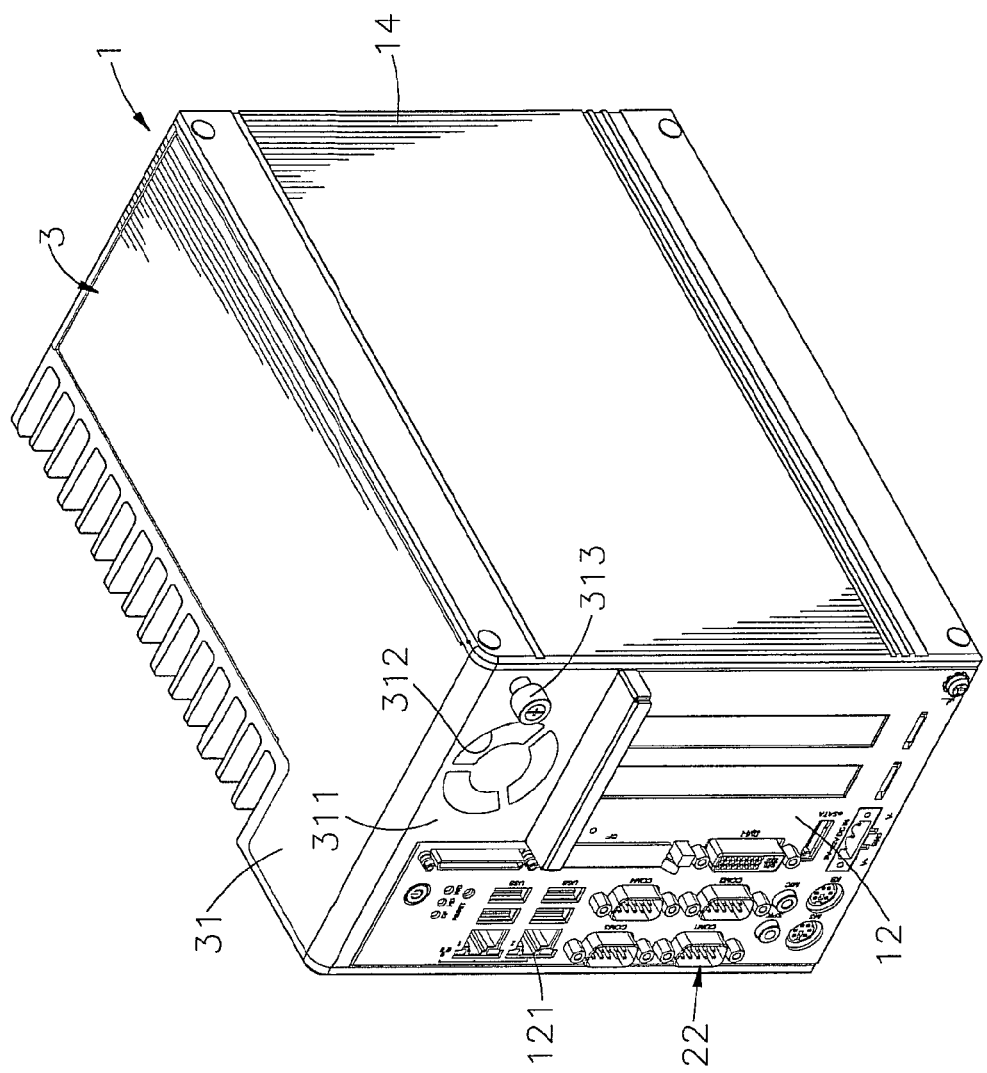
FIG. 1 is an elevational assembly view of a detachable USB fan module mounting structure in accordance with the present invention.
Figure 2:
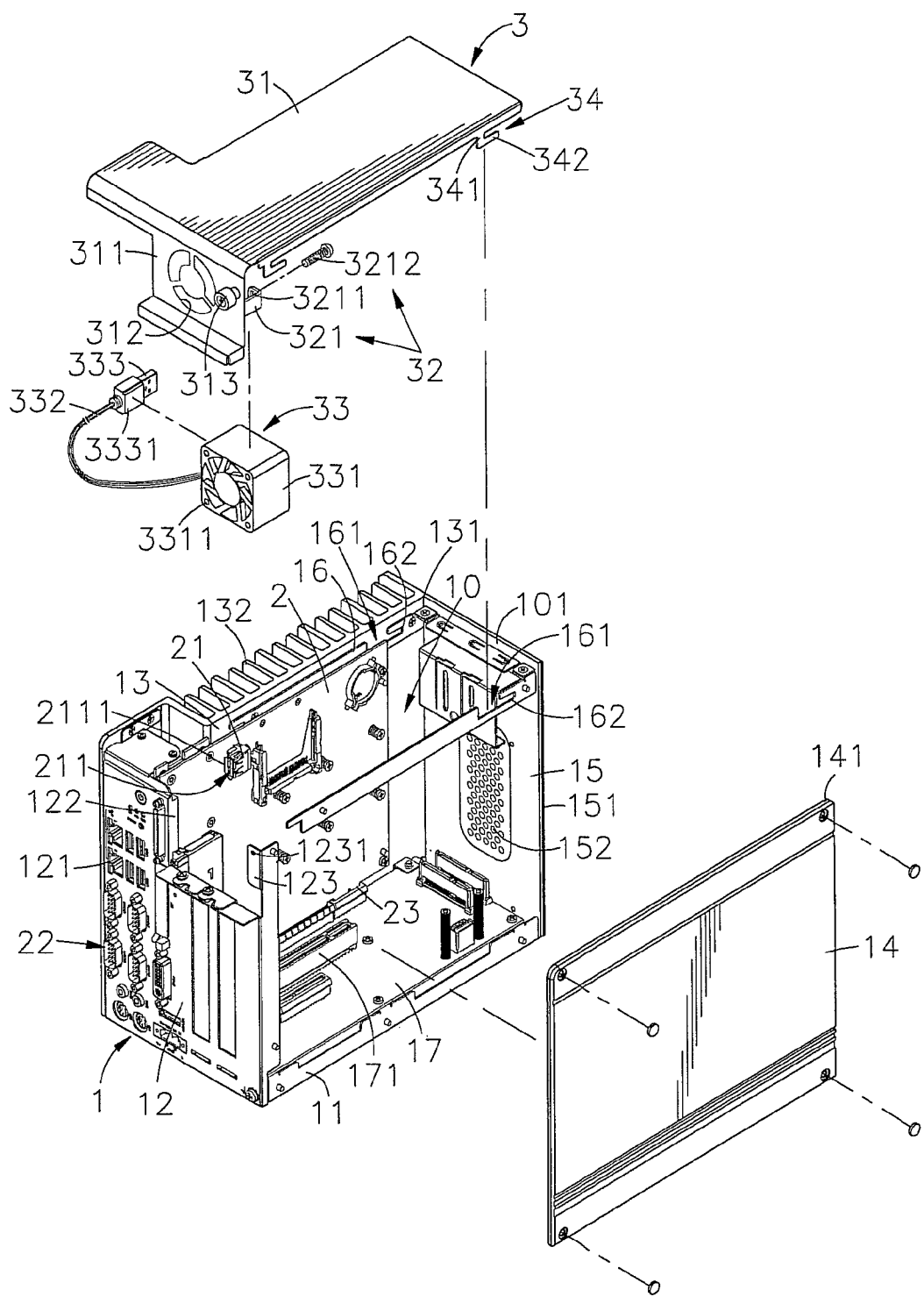
FIG. 2 is an exploded view of the detachable USB fan module mounting structure in accordance with the present invention.
Figure 3:
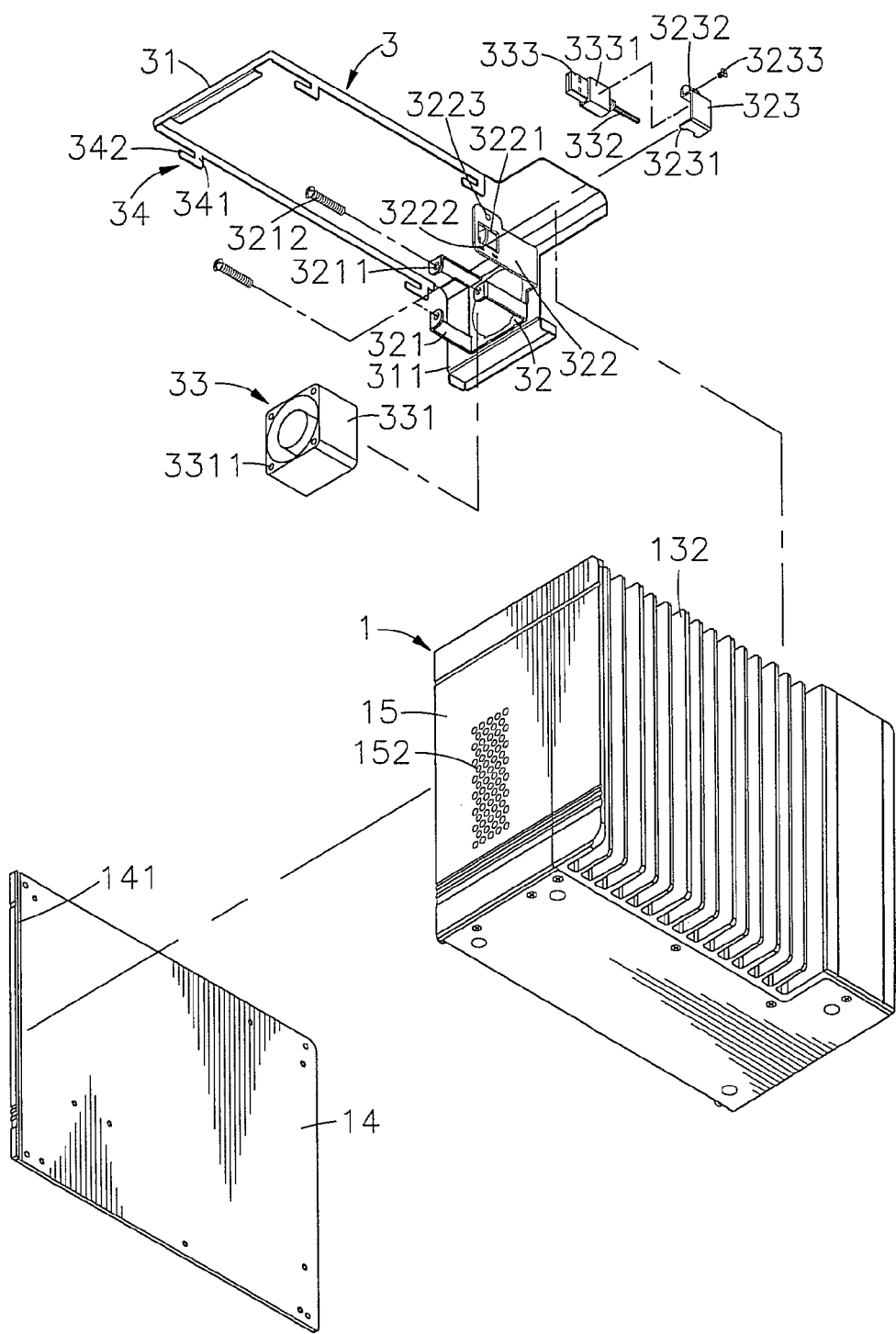
FIG. 3 corresponds to FIG. 2 when viewed from another angle.
Figure 4:
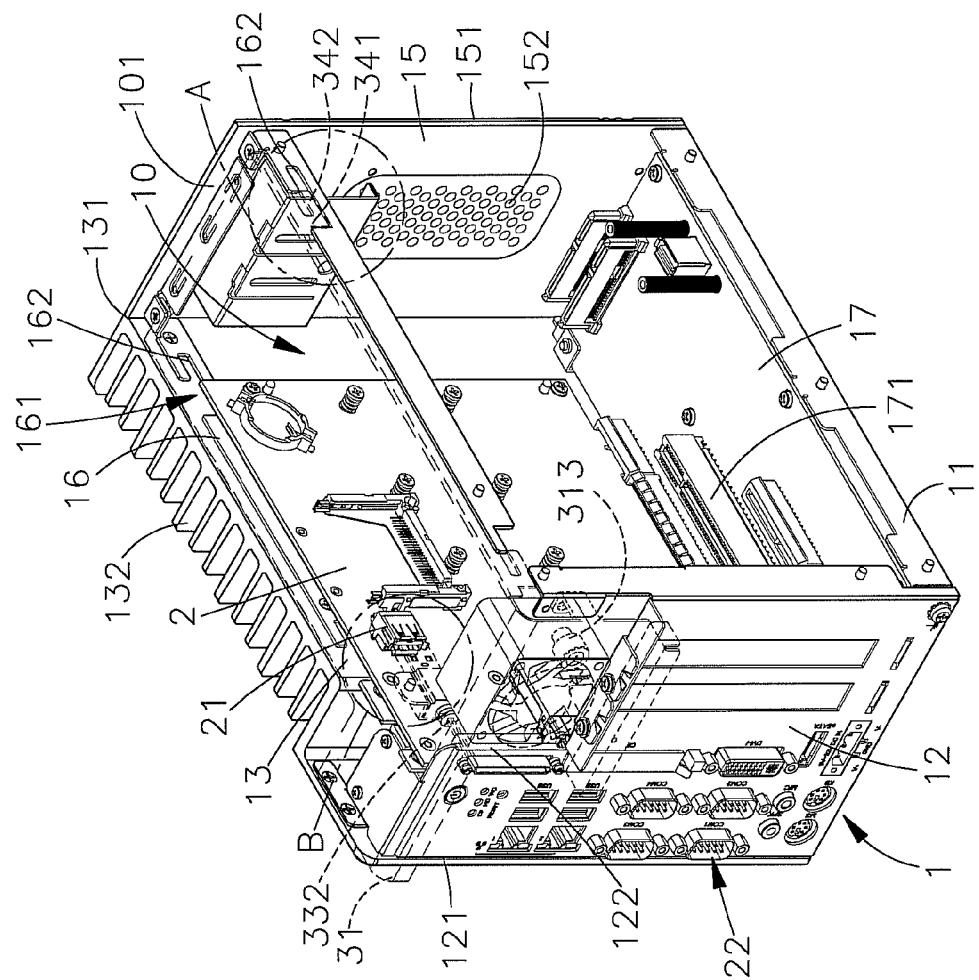
FIG. 4 is a perspective view of the present invention after removal of the cover member and one upright side panel.
Figure 5:
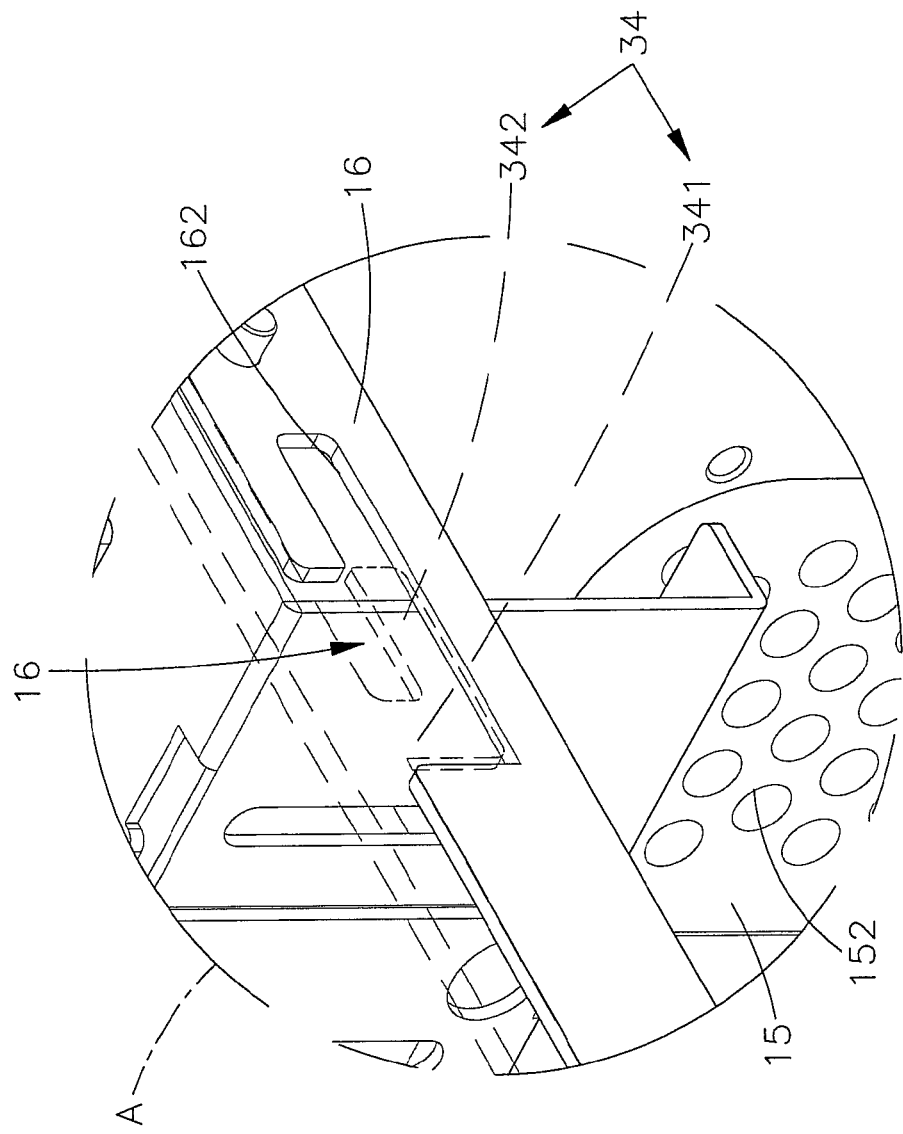
FIG. 5 is an enlarged view of a part of FIG. 4, illustrating the coupling arrangement between the coupling structure of the cover member and one guide rail of the machine case.
Figure 6:
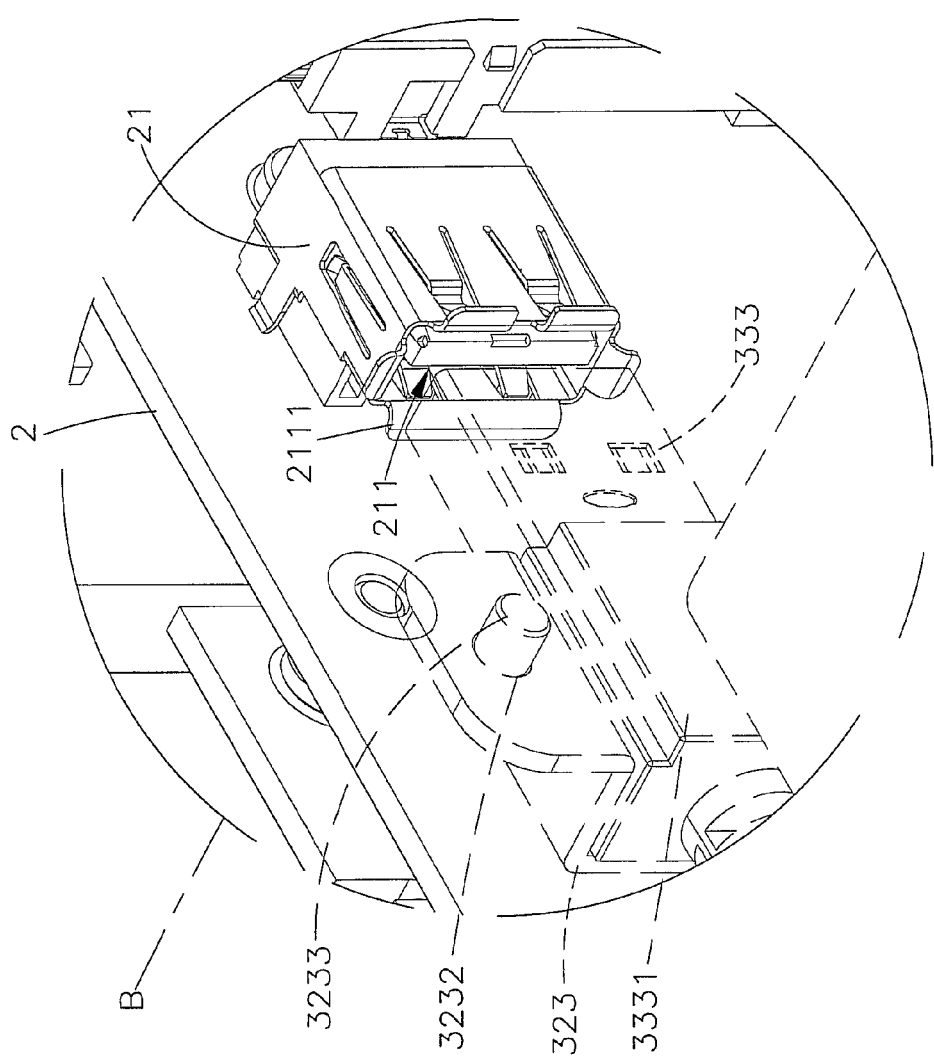
FIG. 6 is an enlarged view of another part of FIG. 4, illustrating the arrangement of the U-shaped clamping plate of the fan module positioning structure and the USB connector.
Figure 7:
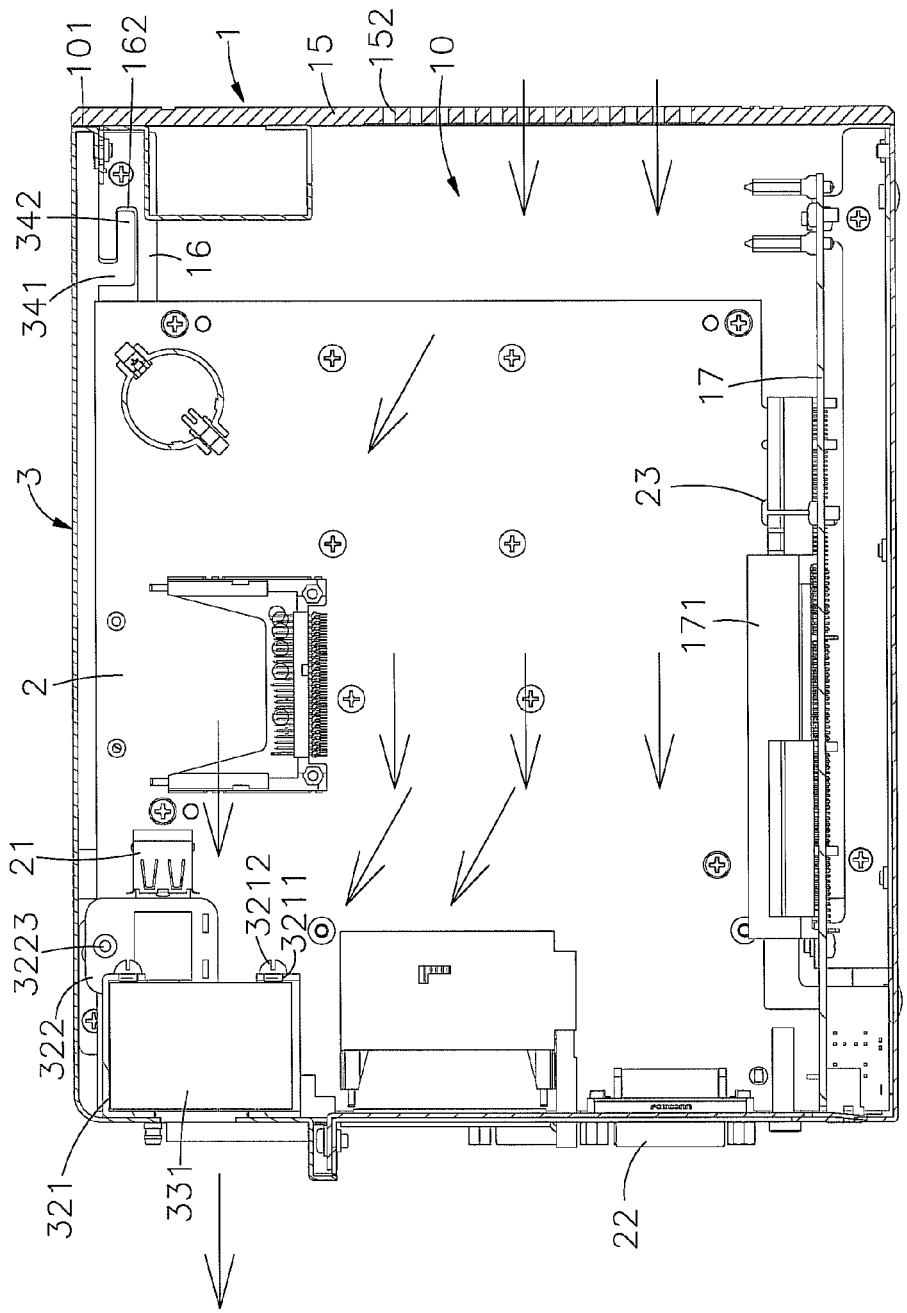
FIG. 7 is a sectional side view of the detachable USB fan module mounting structure in accordance with the present invention.

Referring to FIGS. 1~3, a detachable USB fan module mounting structure in accordance with the present invention is shown comprising a machine case 1, a circuit board 2, a cover member 3 and a USB fan module 33.

The machine case 1 comprises a horizontal bottom panel 11, an upright front panel 12 and an upright back panel 15 respectively upwardly extending from two opposite sides of the horizontal bottom panel 11, opposing first and second upright side panels 13; 14 respectively upwardly extending from the other two opposite sides of the horizontal bottom panel 11 and connected between the upright front panel 12 and the upright back panel 15, an accommodation chamber 10 surrounded by the horizontal bottom panel 11, the upright front panel 12, the first and second upright side panels 13; 14 and the upright back panel 15 and defining a top opening 101, two guide rails 16 respectively and horizontally located on the inner surface of each of the first and second upright side panels 13; 14 at two opposite lateral sides relative to the top opening 101, and a riser board 17 mounted on the horizontal bottom panel 11 and carrying a plurality of adapter sockets 171. Each guide rail 16 has a plurality of vertical insertion notches 161 and a plurality of horizontal retaining slots 162 respectively forwardly extended from the bottom side of each of the vertical insertion notches 161 in direction toward the upright back panel 15.

The aforesaid horizontal bottom panel 11 and upright front panel 12 can be made in integrity by means of bending a sheet member into an angled configuration. The first and second upright side panels 13; 14 are detachable. The first upright side panel 13 is a heat sink extruded from aluminum. The first and second upright side panels 13; 14 and the upright back panel 15 can be fastened to the horizontal bottom panel 11 by screws. However, this mounting method is not a limitation. Further, according to this embodiment, the upright back panel 15 has two coupling flanges 151 respectively extending along two opposite lateral sides thereof and respectively coupled to a respective coupling groove 131; 141 at the first and second upright side panels 13; 14.

The upright front panel 12 has a plurality of slots 121, an opening 122 connected to the top opening 101 of the accommodation chamber 10, a side flange 123 perpendicularly extending along one lateral side thereof for supporting the second upright side panel 14, and a plurality of mounting screw holes 1231 located on the side flange 123. Further, the first upright side panel 13 has a plurality of radiation fins 132 for heat dissipation. Further, the upright back panel 15 has a plurality of air vents 152 for ventilation.

The circuit board 2 is accommodated in the accommodation chamber 10 of the machine case 1. Except the predetermined circuit layout and electronic components, the circuit board 2 further comprises at least one USB connector 21, for example, type A USB jack, a plurality of communication ports 22 for electronic signal in and out that can be selected from the group of USB connector, RJ45 connector, audio connector and power connector, and a connection interface 23 with multiple metal contacts. The communication ports 22 are respectively inserted into the slots 121 of the upright front panel 12 of the machine case 1. The connection interface 23 is electrically connected to one adapter socket 171 of the riser board 17. Thus, the circuit board 2 is kept adjacent to the first upright side panel 13 but spaced from the inner surface of the first upright side panel 13 at a predetermined distance.

The cover member 3 is covered on the top side of the machine case 1 to close the top opening 101, having a bracket 31 downwardly extended from one end thereof, a fan module positioning structure 32 located on the bracket 31, and a coupling structure 34 located on the other end thereof. The bracket 31 has a flat body portion 311 and at least one through hole 312 cut through the flat body portion 311. Further, the bracket 31 is equipped with a fastening member 313. The fan module positioning structure 32 comprises a plurality of retaining rods 321 perpendicularly extended from the inner wall of the flat body portion 311 of the bracket 31 and equiangularly spaced from one another for securing the USB fan module 33, a side plate 322 perpendicularly extended from one lateral side of the flat body portion 311 of the bracket 31 in a substantially parallel manner relative to the retaining rods 321, a locating hole 3221 cut through the side plate 322, and a locating notch 3222 located on the side plate 322 at one lateral side relative to the locating hole 3221, a screw hole 3223 located on the side plate 322 at the other lateral side relative to the locating hole 3221, and a substantially U-shaped clamping plate 323 clamped on the side plate 322. Further, each retaining rod 321 has a mounting through hole 3211 located on the angled distal end thereof for the mounting of one respective screw 3212 to affix the USB fan module 33 to the bracket 31. The coupling structure 34 comprises a plurality of coupling rods 341 and a plurality of retaining tips 342 respectively perpendicularly extended from the coupling rods 341.

The USB fan module 33 comprises an electrical fan device 331, and a power cord 332 extended from the electrical fan device 331 and terminating in an electrical plug 333. The electrical fan device 331 is attached to the flat body portion 311 of the bracket 31 and held down by the retaining rods 321, and then screws 3212 are respectively mounted in the mounting through holes 3211 of the retaining rods 321 and threaded into respective screw holes 3311 of the electrical fan device 331 to affix the electrical fan device 331 to the bracket 31. The electrical plug 333 is inserted with the housing 3331 thereof into the locating hole 3221 at the side plate 322 of the fan module positioning structure 32, and therefore the electrical plug 333 partially protrudes over the side plate 322 of the fan module positioning structure 32. Thereafter, the substantially U-shaped clamping plate 323 is covered on the housing 3331 of the electrical plug 333 and clamped on the side plate 322. Further, the substantially U-shaped clamping plate 323 has a retaining protrusion 3231 extended from its one lateral side and engaged into the locating notch 3222 at the side plate 322, and a mounting through hole 3232 located on its other lateral side and fastened to the screw hole 3223 at the side plate 322 by a screw 3233. Thus, the USB fan module 33 is affixed to the bracket 31.

Further, the electrical plug 333 of the power cord 332 of the USB fan module 33 is a type A USB plug adapted for electrically connecting the electrical fan device 331 to one USB connector 21 at the circuit board 2. This electrical plug 333 is not a regular USB connector ($V_{bus}$ (4.4~5.2 5V)/D−/D+/GND). According to the this embodiment, the design of the USB connector 21 at the circuit board 2 provides four ports for the connection of four electrical plugs 333 to fit different application requirements. Thus, the electrical fan device 331 can be equipped with one single electrical plug 333, or 2, 3 or 4 electrical plugs 333 subject to system control requirements.

Referring to FIGS. 4~7, during installation of the present invention, attach the cover member 3 to the top opening 101 of the machine case 1 to aim the bracket 31 at the horizontal bottom panel 11 of the machine case 1 and to vertically insert the coupling rods 341 of the coupling structure 34 into the respective vertical insertion notches 161 of the guide rail 16. As the width of the vertical insertion notches 161 is slightly greater than the combined width of one coupling rod 341 with the associating retaining tip 342, the coupling rods 341 with the respective retaining tips 342 can be conveniently inserted into the respective vertical insertion notches 161 of the guide rail 16. At this time, the electrical plug 333 of the power cord 332 of the USB fan module 33 is aimed at the plughole 211 of the USB connector 21 at the circuit board 2. Thereafter, push the cover member 3 into position to close the top opening 101 of the machine case 1 and simultaneously to force the respective retaining tips 342 into the respective horizontal retaining slots 162 to prohibit upward movement of the cover member 3 relative to the machine case 1. At this time, the outwardly curved and smoothly arched guide flanges 2111 at two opposite lateral sides of the plughole 211 of the USB connector 21 guide the electrical plug 333 of the power cord 332 of the USB fan module 33 into position, and therefore the USB fan module 33 is electrically connected to the circuit board 2. Further, the flat body portion 311 of the bracket 31 of the cover member 3 is stopped against the side flange 123 of the upright front panel 12 at this time. Thereafter, fasten the fastening member 313 to one mounting screw hole 1231 at the side flange 123 to affix the cover member 3 to the machine case 1.

During operation of the USB fan module 33, outside cooling air is drawn through the air vents 152 of the upright back panel 15 into the inside of the machine case 1 to pass over the heat source (CPU, chips, interface card, etc.) of the circuit board 2 in a parallel manner for heat exchange to lower the temperature and then to keep flowing to the outside of the machine case 1 through the at least one through hole 312 at the flat body portion 311 of the bracket 31, thereby carrying waste heat out of the machine case 1. At the same time, the radiation fins 132 of the upright side panel 13 enhance heat dissipation. This design enables the cover member 3 to be detachably and rapidly installed in the machine case 1 by hand without any tools. Subject to the design of the cover member 3, a USB fan module 33 of any of a variety of models can be selectively used in the machine case 1 that can be designed for any of a variety of electronic systems for different application purposes (for example, a system equipped with high-power PCI/PCIe cards or for application under a high operating temperature environment). The detachable USB fan module mounting structure of the invention also facilitates cleaning and maintenance of the electrical fan.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A detachable USB fan module mounting structure, comprising:
   a machine case comprising a horizontal bottom panel, an upright front panel and an upright back panel respectively upwardly extending from first two opposite sides of said horizontal bottom panel, said upright front panel comprising a plurality of slots, first and second upright side panels respectively upwardly extending from second two opposite sides of said horizontal bottom panel and connected between said first upright front panel and said second upright back panel, an accommodation chamber surrounded by said horizontal bottom panel, said upright front panel, said first upright side panel, said second upright side panel and said upright back panel and defining a top opening opposite to said horizontal bottom panel, two guide rails respectively and horizontally located on an inner surface of each of said first upright side panel and said second upright side panel at two opposite lateral sides relative to said top opening;
   a circuit board accommodated in said accommodation chamber inside said machine case, said circuit board comprising at least one USB connector and a plurality of communication ports respectively inserted into the slots of said upright front panel;
   a USB fan module, said USB module comprising an electrical fan device and a power cord extended from said electrical fan device and terminating in an electrical plug electrically connectable to one said USB connector of said circuit board; and
   a cover member covered on said machine case to close said top opening, said cover member comprising a bracket downwardly extended from one end thereof and adapted for supporting said USB fan module, and a coupling structure located on opposite end thereof for fastening to said guide rails to detachably secure said cover member to said machine case.

2. The detachable USB fan module mounting structure as claimed in claim 1, wherein said machine case comprises a riser board mounted on said horizontal bottom panel and carrying a plurality of adapter sockets; said circuit board further comprises a connection interface electrically connected to one adapter socket of said riser board.

3. The detachable USB fan module mounting structure as claimed in claim 2, wherein said upright back panel comprises two coupling flanges respectively extending along two opposite lateral sides thereof; said first upright side panel and said second upright side panel each comprise a coupling groove respectively coupled to the coupling flanges of said upright back panel.

4. The detachable USB fan module mounting structure as claimed in claim 1, wherein said upright front panel comprises an opening disposed at one side relative to said top opening of said accommodation chamber; said bracket comprises a flat body portion perpendicularly extended from one end thereof and positioned in said opening of said upright front panel and at least one through hole cut through said flat body portion and a fan module positioning structure located on said flat body portion and adapted for securing said electrical fan device of said USB fan module to hold the electrical plug of said power cord of said USB fan module in place.

5. The detachable USB fan module mounting structure as claimed in claim 4, wherein said fan module positioning structure comprises a plurality of retaining rods perpendicularly extended from an inner wall of said flat body portion of said bracket and equiangularly spaced from one another for securing said USB fan module, a side plate perpendicularly extended from one lateral side of said flat body portion of said bracket and a locating hole located on said side plate; said electrical plug of said power cord of said USB fan module comprises a housing inserted into the locating hole at said side plate of said fan module positioning structure.

6. The detachable USB fan module mounting structure as claimed in claim 5, wherein said electrical fan device of said USB fan module comprises a plurality of screw holes; each said retaining rod of said fan module positioning structure comprises a mounting through hole located on an angled distal end thereof, and a screw mounted in each mounting through hole and threaded into one respective screw hole of said electrical fan device to affix said USB fan module to said bracket.

7. The detachable USB fan module mounting structure as claimed in claim 5, wherein said side plate of said fan module positioning structure comprises a locating notch and a screw hole; said fan module positioning structure further comprises a substantially U-shaped lamping plate clamped on said side plate to secure said electrical plug of said power cord of said USB fan module, said U-shaped lamping plate comprising a retaining protrusion extended from one lateral side thereof and engaged into the locating notch of said side plate, and a mounting through hole located on an opposite lateral side thereof and fastened to the screw hole of said side plate by a screw.

8. The detachable USB fan module mounting structure as claimed in claim 1, wherein each said guide rail comprises a plurality of vertical insertion notches and a plurality of horizontal retaining slots respectively forwardly extended from a bottom side of each said vertical insertion notch in direction toward said upright back panel; said coupling structure comprises a plurality of coupling rods respectively vertically insertable into the respective vertical insertion notches of said guide rail, and a plurality of retaining tips respectively perpendicularly extended from said coupling rods and vertically insertable with the respective coupling rods into the respective vertical insertion notches of said guide rails and then horizontally engageable into the respective vertical insertion notches of said guide rail upon a horizontal movement of said cover member relative to said machine case and after insertion into the respective vertical insertion notches of said guide rail.

9. The detachable USB fan module mounting structure as claimed in claim 8, wherein the width of each vertical insertion notch of each said guide rail is greater than the combined width of each said coupling rod with the associating retaining tip.

\* \* \* \* \*